(12) United States Patent
Long

(10) Patent No.: US 10,169,636 B2
(45) Date of Patent: Jan. 1, 2019

(54) SENSOR APPARATUS AND MOBILE TERMINAL

(71) Applicant: SHENZHEN GOODIX TECHNOLOGY CO., LTD., Shenzhen, Guangdong (CN)

(72) Inventor: Wei Long, Guangdong (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/782,192

(22) Filed: Oct. 12, 2017

(65) Prior Publication Data

US 2018/0114051 A1 Apr. 26, 2018

Related U.S. Application Data

(63) Continuation of application No. PCT/CN2016/103201, filed on Oct. 25, 2016.

(51) Int. Cl.
*G06K 9/20* (2006.01)
*G06K 9/00* (2006.01)
(Continued)

(52) U.S. Cl.
CPC ....... *G06K 9/00053* (2013.01); *G06K 9/0002* (2013.01); *G06K 9/0004* (2013.01);
(Continued)

(58) Field of Classification Search
CPC ........... G06K 9/00006–9/0012; G06K 9/0002; G06K 9/0004
See application file for complete search history.

(56) References Cited

U.S. PATENT DOCUMENTS

| 2017/0061193 A1* | 3/2017 | Young | G06K 9/00013 |
| 2017/0161544 A1* | 6/2017 | Fomani | G01J 1/0214 |
| 2017/0365588 A1* | 12/2017 | Chen | H01L 25/0753 |

FOREIGN PATENT DOCUMENTS

| CN | 103458073 A | 12/2013 |
| CN | 104156711 A | 11/2014 |

(Continued)

OTHER PUBLICATIONS

State Intellectual Property Office of the P.R. China (ISR/CN), "International Search Report for PCT/CN2016/103201", China, dated Jun. 28, 2017.

*Primary Examiner* — Brian Werner
(74) *Attorney, Agent, or Firm* — Heslin Rothenberg Farley & Mesiti P.C.

(57) ABSTRACT

The present application provides a sensor apparatus and a mobile terminal. The sensor apparatus includes: a cover, a lower surface of the cover being provided with an ink layer; a sensor, the sensor being arranged below the cover; at least one light-emitting module, the light-emitting module being arranged as parallel to the sensor; an upper reflecting layer and a lower reflecting layer, the upper reflecting layer being arranged on a lower surface of the ink layer, and the lower reflecting layer being arranged on an upper surface of the sensor; and a light transmitting glue layer, the light transmitting glue layer being arranged between the upper reflecting layer and the lower reflecting layer. The sensor apparatus may form a preset bright shape or pattern so as to guide operations of the users in a dark environment, and improve use experience of the users.

9 Claims, 2 Drawing Sheets

(51) Int. Cl.
*H05K 1/03* (2006.01)
*H05K 1/02* (2006.01)
*H05K 1/18* (2006.01)

(52) U.S. Cl.
CPC ....... *G06K 9/00107* (2013.01); *H05K 1/0393* (2013.01); *H05K 1/0281* (2013.01); *H05K 1/189* (2013.01); *H05K 2201/10151* (2013.01)

(56) References Cited

FOREIGN PATENT DOCUMENTS

| | | |
|---|---|---|
| CN | 104251414 A | 12/2014 |
| CN | 204026526 U | 12/2014 |
| CN | 205302331 U | 6/2016 |
| CN | 205486158 U | 8/2016 |
| CN | 205490682 U | 8/2016 |

\* cited by examiner

SENSOR APPARATUS AND MOBILE TERMINAL

CROSS-REFERENCE TO RELATED APPLICATIONS

The present application is a continuation of international application No. PCT/CN2016/103201, filed on Oct. 25, 2016, which is incorporated herein by reference in its entirety.

TECHNICAL FIELD

The present application relates to the technical field of sensor identification, and in particular, relates to a sensor apparatus and a mobile terminal having the sensor apparatus.

BACKGROUND

At present, with consumers' demands on diversity and differentiation of the biological identification function, and demands on security of biological identification data, the biological identification function and the security of consumer electronics are drastically developed.

A conventional concealed biological identification device includes a cover, a biological identification sensor, and a flexible printed circuit (FPC) or a rigid flexible printed circuit (RFPC).

The conventional concealed biological identification device only has the biological identification function, which is single in functionality. In addition, the conventional concealed biological identification device has only one color in appearance, or has no touch guiding function in the darkness, which may not satisfy use preferences of the consumers.

In the current market, with respect products having a light-emitting pattern, a thick backlight module implements uniform light and the light is transmitted out via the pattern on the panel. Such an independent structure results in a large and thick product, which is not applicable to fingerprint identification sensors requiring a small thickness.

SUMMARY

To overcome the defects of the related products in the prior art, the present application provides a sensor apparatus and a mobile terminal to solve the problem that a conventional concealed biological identification device has no touch guiding function in the darkness, and is large and thick. In the meantime, the biological information of a user is identified and detected by using an optical signal.

To solve the above technical problem, embodiments of the present application employ the following technical solutions:

The present application provides a sensor apparatus, including:

a cover, a lower surface of the cover being provided with an ink layer;

a sensor, the sensor being arranged below the cover;

at least one light-emitting module, the light-emitting module being arranged as parallel to the sensor;

an upper reflecting layer and a lower reflecting layer, the upper reflecting layer being arranged on a lower surface of the ink layer, and the lower reflecting layer being arranged on an upper surface of the sensor; and a light transmitting glue layer, the light transmitting glue layer being arranged between the upper reflecting layer and the lower reflecting layer.

As a further improvement of the present application, the ink layer on the lower surface of the cover and the upper reflecting layer are at least provided with a window.

As a further improvement of the present application, the sensor apparatus further includes at least one receiving module; wherein the receiving module and the sensor are arranged as parallel to the at least light-emitting module.

As a further improvement of the present application, a light shielding layer is arranged between the light-emitting module and the receiving module.

As a further improvement of the present application, the sensor and the at least one light-emitting module are integrally packaged.

As a further improvement of the present application, the sensor, the at least one light-emitting module and the at least one receiving module are integrally packaged.

As a further improvement of the present application, the sensor apparatus further includes a collar; wherein the collar is arranged on a periphery of the sensor apparatus.

As a further improvement of the present application, a flexible printed circuit board and a reinforcing plate are arranged below the sensor apparatus, the reinforcing plate being positioned below the flexible printed circuit board.

The present application further provides a mobile terminal, including the sensor apparatus as described above.

Compared with the prior art, the present application has the following advantages:

The light emitted by the light-emitting module of the sensor apparatus may form a predetermined bright shape or pattern via a background color and the opening of the ink layer, which is used to guide the user for operations in a dark environment, and improve use experience. The sensor apparatus has a simple structure and a small size, and may further implement such biological identification functions as fingerprint identification, heart rate detection and the like.

BRIEF DESCRIPTION OF THE DRAWINGS

To describe technical solutions according to the embodiments of the present application, drawings that are to be referred for description of the embodiments are briefly described hereinafter. Apparently, the drawings described hereinafter merely illustrate some embodiments of the present application. Persons of ordinary skill in the art may also derive other drawings based on the drawings described herein without any creative effort.

DETAILED DESCRIPTION

For better understanding of the present application, the present application is thoroughly described with reference to relevant accompanying drawings. The accompanying drawings show preferred embodiments of the present application.

However, the present application may be implemented in a plurality of forms or ways, and is not limited to the embodiments described herein. On the contrary, the embodiments described herein are intended to make the disclosure of the present application more clearly and thoroughly understood.

Unless otherwise defined, all the technical and scientific terms used in this specification convey the same meanings as the meanings commonly understood by a person skilled in the art to which the present application pertains. Additionally, the terms used in the specification the present application are merely for describing the objective of the specific embodiments, and are not intended to limit the present application.

Embodiment 1

Figure 1A:
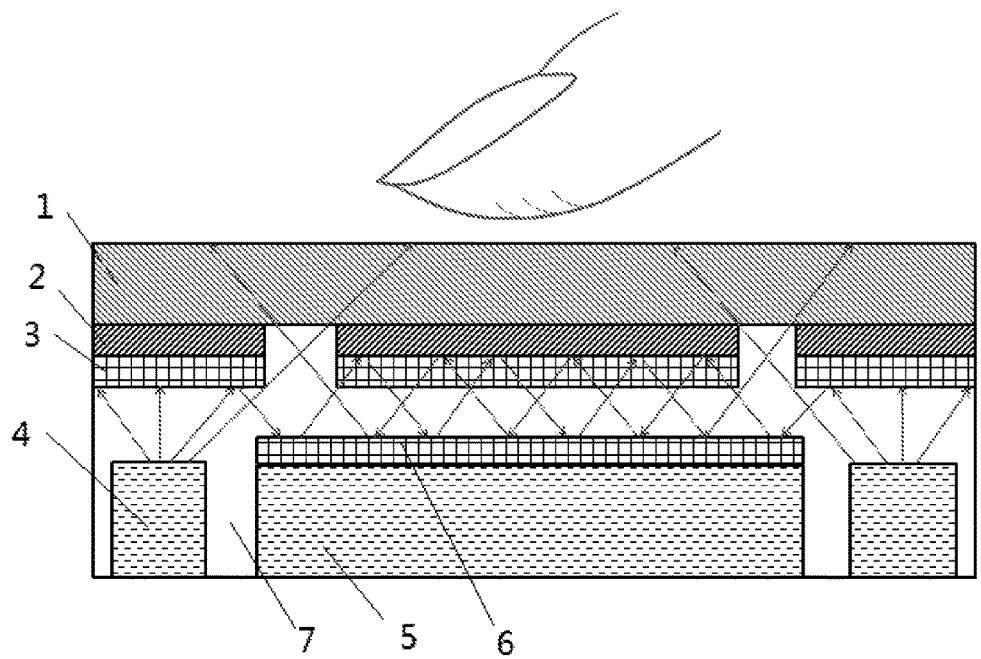
FIG. 1a is a schematic structural diagram of a sensor apparatus according to a first embodiment of the present application.

Referring to FIG. 1, a schematic structural diagram of a sensor apparatus according to a first embodiment of the present application is given. The sensor apparatus includes a cover 1, an ink layer 2, a light transmitting glue layer 7, an upper reflecting layer 3, a lower reflecting layer 6, a sensor 5 and at least one light-emitting module (an LED) 4.

The cover 1a is made from a transparent smooth material, such as sapphire, ceramic, glass and the like. A lower surface of the cover 1 is provided with the ink layer 2 configured to shield the light, and an opening is arranged in the middle area of the ink layer 2. A predetermined shape or pattern may be formed via a background color and the opening of the ink layer 2, and the background color, and the shape, size and quantity of the openings of the ink layer 2 may be defined according to actual needs. The upper reflecting layer 3 is arranged on a lower surface of the ink layer 2. Optionally, the upper reflecting layer 3 is also provided with an opening, and the shape, size and quantity of the openings of the upper reflecting layer 3 are consistent with those of the ink layer 2.

Optionally, the cover 1 may have an opening so as to cooperate with the ink layer to form a specific pattern, where the opening is positioned on a front side facing towards the outside or a back side facing towards the ink layer 2, and a light insulating material is applied to a side wall in the opening of the cover 1 to prevent light from diffusion.

The light-emitting module 4 is a light source for supplying light. In this embodiment, the light-emitting module 4 includes at least one LED device, where the LED device includes an LED and related circuit assemblies supporting normal operations of the LED. The LED device voluntarily selects different types of LEDs according to desired light at different wavelengths or an application object and functions, Light-emitting frequency and angle of the LED device are not limited. The opening of the ink layer 2 is defined according to the wavelength of the light emitted by the LED, such that sufficient light may form a predetermined bright shape or pattern in a dark environment via the opening of the ink layer 2 so as to guide operations of the users.

The sensor 5 is configured to identify and detect the received information, where the information includes light, pressure, capacitance and voltage or current variations caused by the light, pressure and capacitance. Specifically, the sensor 5 may be a biological sensor and is configured to collect biological information of the users, for example, fingerprints and the like, and the sensor 5 and the light-emitting module 4 are arranged as parallel below the ink layer 2. The LED device of the light-emitting module 4 is arranged on one side or on two sides of the sensor 5; and the lower reflecting layer 6 is arranged on an upper surface of the sensor 5.

Both the upper reflecting layer 3 and the lower reflecting layer 6 are configured to reflect light. In some embodiments, the capability of reflecting light may be enhanced by increasing light guiding spots on the upper reflecting layer 3 and the lower reflecting layer 6. The upper reflecting layer 3 and the lower reflecting layer 6 may be made from the same material, or may be made from different materials. When the upper reflecting layer 3 and the lower reflecting layer 6 are made from different materials, a material having anti-reflection and uniform light functions may be used to fabricate the upper reflecting layer 3, and a material having a good reflection function may be used to fabricate the lower reflecting layer 6. The coverage method of the upper reflecting layer 3 includes filming and the like, and the coverage method of the lower reflecting layer 6 includes electroplating, filming and the like. Optionally, the reflections of the reflecting layers to light are total reflection, and the total reflection may effectively prevent loss in the course of light transmission. Since a transmission path of light emitted by the LED device in the sensor apparatus according to the present application is short, the loss during the light transmission may be negligible. In other embodiments, the reflections of the reflecting layers to light may be non-total reflection, the reflecting performances of the reflecting layers are defined by the materials of the reflecting layers, and the materials of the reflecting layers are not specifically defined in this embodiment.

The sensor apparatus further includes a light transmitting glue layer 7. The light transmitting glue layer 7 is filled in a gap between the upper reflecting layer 3 and the lower reflecting layer 6 so as to support a physical structure of each function module, and the light transmitting glue layer 7 has elasticity, and thus may recover and remain the shape in a certain range of deformation. The light transmitting glue layer 7 is made from a transparent material such as epoxy resin and the like, and the light transmitting glue layer 7 may transmit light due to its light transmittance feature.

Optionally, the gaps, formed via the openings, of the ink layer 2 and the upper reflecting layer 3 may leave a margin, and may also be filled by the light transmitting glue layer 7.

Figure 1B:
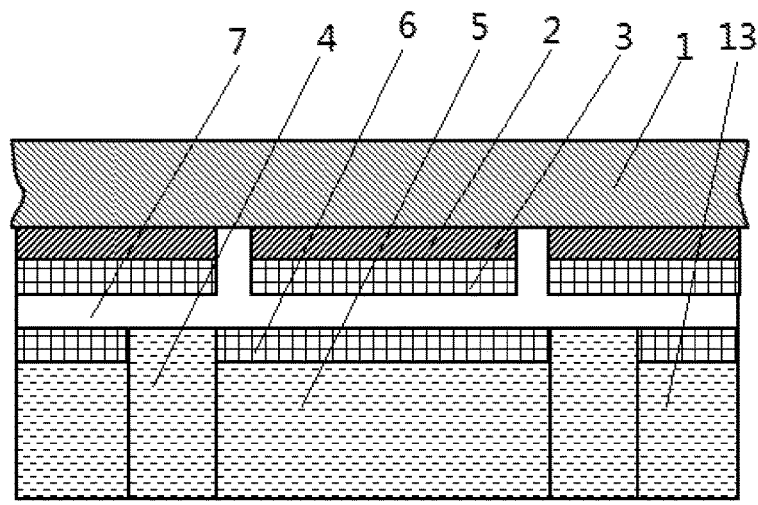
FIG. 1b is another schematic structural diagram of the sensor apparatus according to the first embodiment of the present application.

Optionally, referring to FIG. 1b, another embodiment of the present application is illustrated. In this embodiment, the sensor apparatus is provided with two light-emitting modules 4 and a light shielding plate 13. This embodiment is different from the above embodiment in that, in this embodiment, the sensor 5, the light-emitting modules 4 and the light shielding plate 13 are integrally packaged, whereas in the above embodiment, the sensor 5 is individually encapsulated, and at least one light-emitting module 4 is a module packaged independently of the sensor.

In this embodiment, the light emitted by the LED device is finally converged to the opening position of the ink layer 2 via the reflections of the inner reflecting layers, such that the light may form a preset bright shape or pattern via a background color and the opening of the ink layer 2. The light may guide operations of the users in a dark environment, and improve use experience of the users.

Embodiment 2

Figure 2:
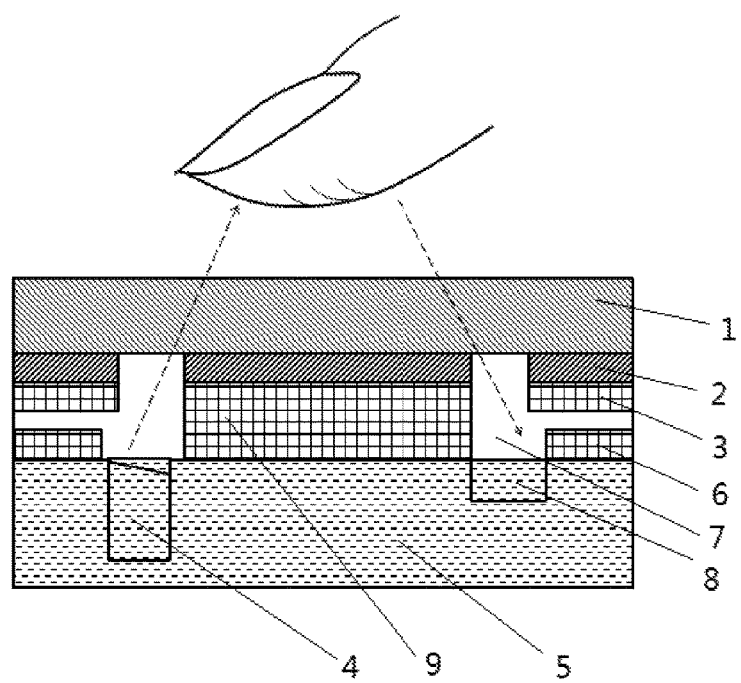
FIG. 2 is a schematic structural diagram of a sensor apparatus according to a second embodiment of the present application.

Based on the first embodiment, FIG. 2 is a schematic structural diagram of a sensor apparatus according to a second embodiment of the present application. The sensor apparatus includes a receiving module 8, and the receiving module 8 is configured to receive the light emitted by the light-emitting module 4 and reflected back by a user's fingers. A light shielding layer 9 is arranged between the light-emitting module 4 and the receiving module 8, and is positioned between the ink layer 2 and the sensor 5. No gap is provided among the ink layer 2, the light shielding layer 9 and the sensor 5. The light shielding layer 9 is made from a light proof material, and configured to shield the light so as to prevent the light emitted by the light-emitting module 4 from being directly received by the receiving module 8.

The functions such as heart rate detection and the like may be implemented by analyzing light reflected back by the user's fingers. In addition, in a case where the sensor 5 is a fingerprint sensor, by using the reflection light received by the receiving module 8, a liveness detection of a user may be achieved, possibility of using forged fingerprints is eliminated, and security of the fingerprint identification is improved.

In this embodiment, the sensor 5, the light-emitting module 4 and the receiving module 8 are integrally packaged. The lower reflecting layer 6 is arranged on an upper surface of the sensor 5, and is provided with openings at corresponding positions on a top end of the light-emitting module 4 and on a top end of the receiving module 8. The shape of the opening is consistent with the top end of the light-emitting module 4 and the top end of the receiving module 8, and the shape of a contact surface of the sensor. In other embodiments, the sensor 5 may be individually encapsulated, and the light-emitting module 4 and the receiving module 8 are structures which are independent of the sensor.

In this embodiment, the receiving module 8 is further arranged, and is configured to receive light reflected back by the user's fingers. The functions such as the liveness detection, the heart rate detection and the like may be implemented while the light-emitting guiding is provided.

Embodiment 3

Figure 3:
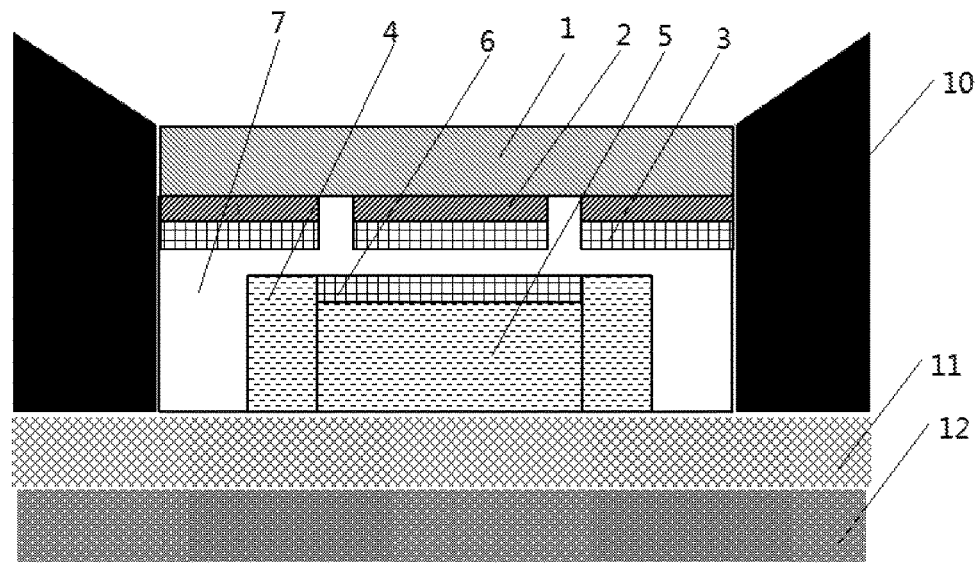
FIG. 3 is a schematic structural diagram of a sensor apparatus according to a third embodiment of the present application.

Based on the above two embodiments, FIG. 3 is a schematic structural diagram of a sensor apparatus according to a third embodiment of the present application. The sensor apparatus further includes a collar 10, a flexible printed circuit board 11 and a reinforcing plate 12.

The collar 10 is arranged on a periphery of the sensor apparatus, and wraps a cover 1 and other components in the inner side of the sensor apparatus. In this embodiment, the collar 10 is a metal ring, but does not limited to the metal ring, and in other embodiments, the collar 10 may be in other materials. The shapes formed by the collar 10 on a face of the cover 1 include a rectangle, a circular and the like.

The sensor apparatus are arranged as parallel to the above of the flexible printed circuit board 11, and the reinforcing plate 12 is positioned below the flexible printed circuit board, and is configured to enhance the toughness strength of the flexible printed circuit board 11.

Reference may be made to the above two embodiments for the specific structure of the sensor apparatus, which is not described in this embodiment any further.

Embodiment 4

Based on the sensor apparatus according to the above embodiments, this embodiment provides a mobile terminal which includes the sensor apparatus as described above, and thus implements such functions as user fingerprint detection, heart rate detection, aliveness detection and the like on the mobile terminal.

The mobile terminal in this embodiment includes, but not limited to, a smart phone, a laptop computer, a tablet computer or the like.

Described above are preferred embodiments of the present application. However, implementation of the present application is not limited to the above embodiments. Any variations, polishments, substitutions, combinations, or simplifications, or the like equivalent replacements made to the present application without departing from the spiritual essence and principle of the present application shall be all covered within the protection scope of the present application.

What is claimed is:

1. A sensor apparatus, comprising:
   a cover, a lower surface of the cover being provided with an ink layer;
   a sensor, the sensor being arranged below the cover;
   at least one light-emitting module, the light-emitting module being arranged as parallel to the sensor;
   an upper reflecting layer and a lower reflecting layer, the upper reflecting layer being arranged on a lower surface of the ink layer, and the lower reflecting layer being arranged on an upper surface of the sensor; and
   a light transmitting glue layer, the light transmitting glue layer being arranged between the upper reflecting layer and the lower reflecting layer.

2. The sensor apparatus according to claim 1, wherein the ink layer on the lower surface of the cover and the upper reflecting layer are at least provided with a window.

3. The sensor apparatus according to claim 1, further comprising at least one receiving module; wherein the receiving module and the sensor are arranged as parallel to the at least one light-emitting module.

4. The sensor apparatus according to claim 3, wherein a light shielding layer is arranged between the light-emitting module and the receiving module.

5. The sensor apparatus according to claim 1, wherein the sensor and the at least one light-emitting module are integrally packaged.

6. The sensor apparatus according to claim 3, wherein the sensor, the at least one light-emitting module and the at least one receiving module are integrally packaged.

7. The sensor apparatus according to claim 1, further comprising a collar; wherein the collar is arranged on a periphery of the sensor apparatus.

8. The sensor apparatus according to claim 1, wherein a flexible printed circuit board and a reinforcing plate are arranged below the sensor apparatus, the reinforcing plate being positioned below the flexible printed circuit board.

9. A mobile terminal, comprising a sensor apparatus as defined in claim 1.

* * * * *